United States Patent
Kim et al.

(10) Patent No.: US 10,043,693 B1
(45) Date of Patent: Aug. 7, 2018

(54) METHOD AND APPARATUS FOR HANDLING SUBSTRATES IN A PROCESSING SYSTEM HAVING A BUFFER CHAMBER

(71) Applicant: Applied Materials, Inc., Santa Clara, CA (US)

(72) Inventors: Jaeyoung Kim, Santa Clara, CA (US); James Hoffman, San Jose, CA (US); Atsushi Kitani, Nara (JP); Young Taek Kwon, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/615,456

(22) Filed: Jun. 6, 2017

(51) Int. Cl.
*H01L 21/67* (2006.01)
*H01L 21/677* (2006.01)
*H01L 21/02* (2006.01)
*H01L 21/683* (2006.01)
*H01L 21/66* (2006.01)

(52) U.S. Cl.
CPC .. *H01L 21/67276* (2013.01); *H01L 21/02274* (2013.01); *H01L 21/67017* (2013.01); *H01L 21/67201* (2013.01); *H01L 21/67253* (2013.01); *H01L 21/67748* (2013.01); *H01L 21/683* (2013.01); *H01L 22/20* (2013.01)

(58) Field of Classification Search
CPC ................................. H01L 21/67276
See application file for complete search history.

(56) References Cited

U.S. PATENT DOCUMENTS

| | | | |
|---|---|---|---|
| 5,928,389 A * | 7/1999 | Jevtic | G05B 19/41865 29/25.01 |
| 6,071,055 A | 6/2000 | Tepman | |
| 6,103,055 A | 8/2000 | Maher et al. | |
| 6,122,566 A * | 9/2000 | Nguyen | H01L 21/67167 438/908 |
| 6,168,672 B1 * | 1/2001 | Nguyen | H01L 21/67028 134/1.1 |
| 6,192,291 B1 | 2/2001 | Kwon | |
| 6,224,638 B1 | 5/2001 | Jevtic et al. | |
| 6,336,204 B1 | 1/2002 | Jevtic | |
| 6,418,355 B1 | 7/2002 | Kondou | |
| 6,440,261 B1 | 8/2002 | Tepman et al. | |
| 6,460,369 B2 | 10/2002 | Hosokawa | |
| 6,460,550 B2 | 10/2002 | Nguyen | |
| 6,468,814 B1 * | 10/2002 | Frees | H01L 21/67253 250/282 |
| 6,496,746 B2 | 12/2002 | Jevtic | |
| 6,519,498 B1 | 2/2003 | Jevtic et al. | |

(Continued)

*Primary Examiner* — Thomas Randazzo
(74) *Attorney, Agent, or Firm* — Patterson + Sheridan LLP

(57) ABSTRACT

Implementations described herein generally relate to a method and apparatus for processing substrates in a processing system. The method includes identifying, in a buffer chamber coupled to a transfer chamber of a processing system, a first substrate that has been in the buffer chamber longer than a predetermined duration and identifying a first destination chamber of the processing system for the first substrate. After identifying the first substrate, a buffer chamber time-out operation is performed. The buffer time out operation includes suspending movement of substrates from a load lock chamber to the transfer chamber and removing the first substrate from the buffer chamber.

20 Claims, 7 Drawing Sheets

(56) References Cited

U.S. PATENT DOCUMENTS

| | | | |
|---|---|---|---|
| 6,725,114 | B1 | 4/2004 | Jevtic |
| 6,729,824 | B2 | 5/2004 | Lei et al. |
| 8,527,080 | B2 | 9/2013 | Assaf et al. |
| 9,076,991 | B2 | 7/2015 | Kurita et al. |
| 2003/0000468 | A1 | 1/2003 | Jevtic et al. |
| 2005/0071043 | A1 | 3/2005 | Jevtic et al. |
| 2008/0216077 | A1 | 9/2008 | Emani et al. |
| 2010/0228372 | A1 | 9/2010 | Norman |
| 2012/0213938 | A1* | 8/2012 | Koparal ............ C23C 14/568 427/404 |
| 2017/0213750 | A1* | 7/2017 | Khaja ............... B65G 43/00 |

* cited by examiner

METHOD AND APPARATUS FOR HANDLING SUBSTRATES IN A PROCESSING SYSTEM HAVING A BUFFER CHAMBER

BACKGROUND

Field

Implementations described herein generally relate to semiconductor processing systems. More specifically, the implementations relate to a method and apparatus for handling substrates in a multiple chamber semiconductor processing system having a buffer chamber.

Description of the Related Art

Large area substrates are used to produce flat panel displays (i.e., LCD, OLED, and other types of flat panel displays), solar panels, and the like. Large area substrates are generally processed in one or more vacuum processing chambers, where various deposition, etching, plasma processing and other circuit and/or device fabrication processes are performed. The vacuum processing chambers are typically coupled by a common vacuum transfer chamber that contains a transfer robot that transfers the substrates between the different vacuum processing chambers. The assembly of the transfer chamber and other chambers connected to the transfer chamber (e.g., the processing chambers) is often referred to as a processing system. During fabrication of flat panel displays, the substrate is moved between various processing chambers while under a vacuum condition.

Each processing chamber may perform a different stage or phase of semiconductor wafer processing. To effectuate wafer transfer amongst the load lock chambers, processing chambers, and the buffer chamber, the transfer chamber contains a transfer robot. The transfer robot transfers substrates amongst the different chambers under the control of a controller. The controller controls the substrate transfer performed by the transfer robot of the processing system.

The transfer robot may transfer a substrate to the buffer chamber when a destination chamber, for example one of the processing chambers, is unavailable. Multiple substrates may be stored in the buffer chamber. The handling of the substrates stored in the buffer chamber helps maintain a high throughput of substrates through the processing system.

There is a need for an apparatus and method for improving the handling of substrates stored in the buffer chamber.

SUMMARY

Implementations described herein generally relate to an apparatus for and methods of depositing material on a substrate. In one implementation, a method for processing substrates in a processing system includes identifying, in a buffer chamber coupled to a transfer chamber of a processing system, a first substrate that has been in the buffer chamber longer than a predetermined duration and identifying a first destination chamber of the processing system for the first substrate. After identifying the first substrate, a buffer chamber time-out operation is performed. The buffer time out operation includes suspending movement of substrates from a load lock chamber to the transfer chamber and removing the first substrate from the buffer chamber.

In another implementation, a method for processing substrates includes identifying, in a buffer chamber of a processing system, a first substrate that has been in the buffer chamber longer than a predetermined duration. The processing system further includes a first transfer chamber, a load lock chamber coupled to the first transfer chamber, a second transfer chamber, an intermediate transfer chamber coupled to the buffer chamber, a first passthrough load lock chamber that couples the first transfer chamber with the intermediate transfer chamber, and a second passthrough load lock chamber that couples the second transfer chamber with the intermediate transfer chamber. The method further includes identifying a first destination chamber for the first substrate, wherein the first destination chamber is coupled to the second transfer chamber. After identifying the first substrate, performing a buffer chamber time-out operation. The buffer chamber time-out operation includes suspending movement of substrates from the load lock chamber to the first transfer chamber and removing the first substrate from the buffer chamber.

In another implementation, a non-transitory machine readable storage medium having stored thereon a computer program for processing substrates in a processing system is provided. The computer program includes a routine of set instructions for causing the processing system to perform a process. The process includes identifying, in a buffer chamber coupled to a transfer chamber of a processing system, a first substrate that has been in the buffer chamber longer than a predetermined duration and identifying a first destination chamber of the processing system for the first substrate. After identifying the first substrate, a buffer chamber time-out operation is performed. The buffer time out operation includes suspending movement of substrates from a load lock chamber to the transfer chamber and removing the first substrate from the buffer chamber.

BRIEF DESCRIPTION OF THE DRAWINGS

So that the manner in which the above recited features of the present disclosure can be understood in detail, a more particular description of the disclosure, briefly summarized above, may be had by reference to implementations, some of which are illustrated in the appended drawings. It is to be noted, however, that the appended drawings illustrate only selected implementations of this disclosure and are therefore not to be considered limiting of its scope, for the disclosure may admit to other equally effective implementations.

To facilitate understanding, identical reference numerals have been used, wherever possible, to designate identical elements that are common to the Figures. Additionally, elements of one implementation may be advantageously adapted for utilization in other implementations described herein.

DETAILED DESCRIPTION

Embodiments of the disclosure generally relate to a vacuum processing system for vacuum processing large area substrates (e.g., LCD, OLED, and other types of flat panel displays, solar panels, and the like). Although a vacuum processing system for performing depositions on large area substrates is described herein, the vacuum processing system may alternatively be configured to perform other vacuum processes on substrates, such as etching, ion implantation, annealing, plasma treating, and physical vapor depositions among other processes. A controller is used to operate the processing system. The controller executes a buffer chamber time-out routine for handling substrates stored in the buffer chamber. One or more substrates may get stranded in the buffer chamber for an extended duration. The use of the buffer chamber time-out routine helps prevent a substrate from becoming stranded in the buffer chamber in excess of a predetermined time period. The buffer chamber time-out routine provides a method for suspending selected operations of the processing system for a buffer time-out period when a substrate has been in the buffer chamber longer than a predetermined duration. During the buffer time-out period, movement of substrates from a load lock chamber is suspended, and substrates in the buffer chamber are moved to destination chambers that have been identified.

Figure 1:
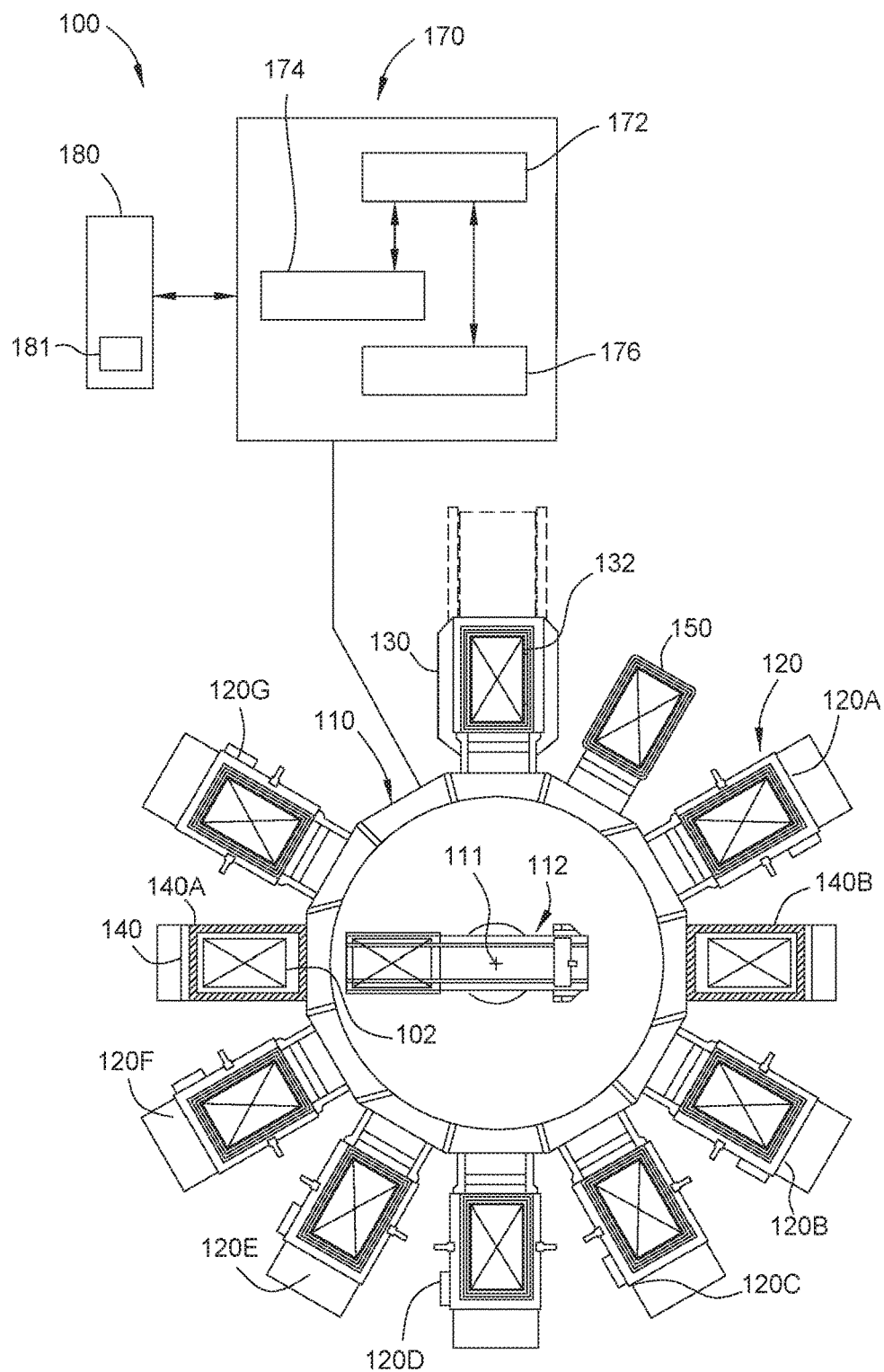
FIG. 1 is a top plan view of a processing system for vacuum processing a plurality of substrates having a transfer chamber, according to one embodiment.

FIG. 1 is a plan view of a processing system 100 for performing vacuum processing on a plurality of substrates 102, according to one embodiment of the disclosure. The processing system 100 has a transfer chamber 110. A plurality of processing chambers 120, such as processing chamber 120A through 120G, are coupled to the transfer chamber 110. The processing chambers 120A through 120F can each be a chemical vapor deposition (CVD) chamber. Additionally, one or more load lock chambers 140 are coupled to the transfer chamber 110. A buffer chamber 150 is coupled to the transfer chamber 110. Optionally, a mask chamber 130 is coupled to the transfer chamber 110. The transfer chamber 110, processing chambers 120, load lock chamber 140, buffer chamber 150, as well as any additionally attached chambers forming the processing system 100, are coupled together using seals to maintain a vacuum environment therein. A controller 170 controls the processing system 100. The controller 170 has a central processing unit 172, a memory 174, support circuits 176, and I/O peripherals 180. The controller 170 executes an operational program that includes a plurality of routines to operate the processing system 100.

The operational program is a computer program that may be stored in the memory 174 of the controller 170 or a non-transitory computer readable storage medium 181. The non-transitory computer readable storage medium may include disks, flash drives, and other non-transitory medium, and may be loaded onto the memory 174 using the I/O peripherals 180. The non-transitory machine readable storage medium has stored thereon a computer program for processing substrates in the processing system 100. The computer program includes a routine of set instructions for causing the processing system 100 to perform the operations for embodiments disclosed herein.

Figure 2:
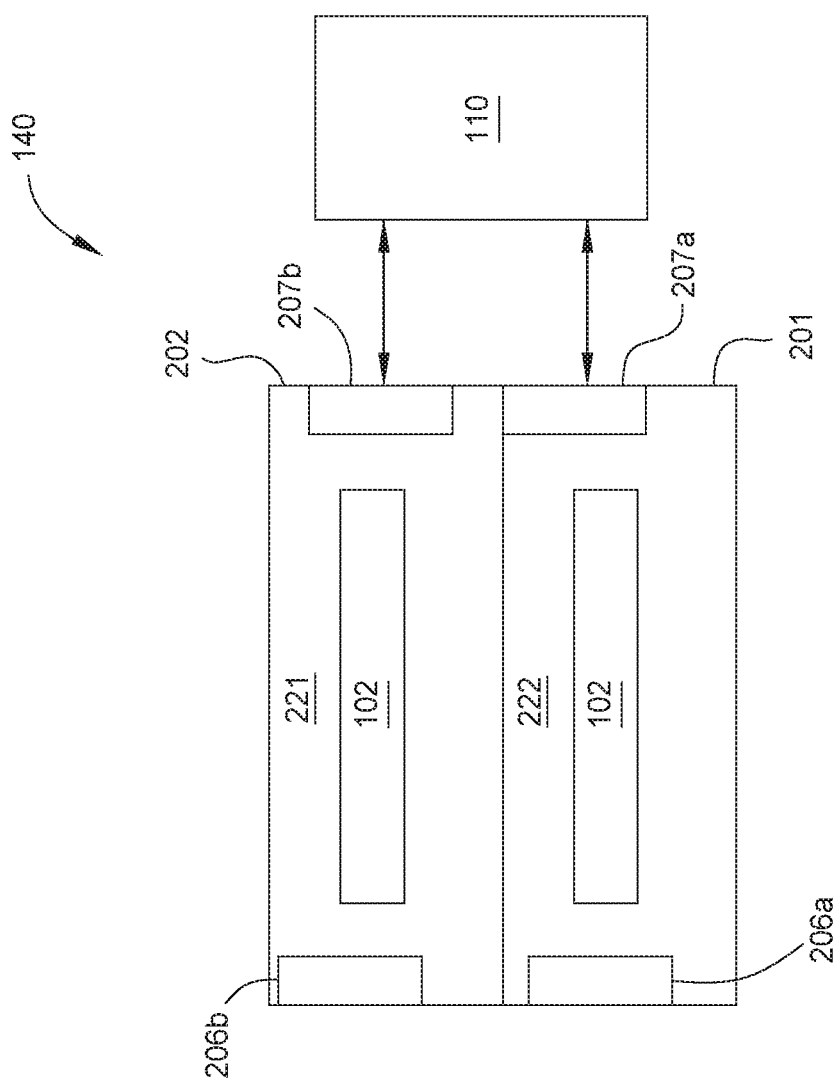
FIG. 2 is a side cross-sectional view of a load lock chamber shown in the processing system in FIG. 1, according to one embodiment.

The processing system 100 is configured to hold and process multiple substrates 102. A substrate 102 may be made of, or may include glass, plastic or other material. The substrate 102 may be moved to and from the processing system 100 through the load lock chamber 140. Turning briefly to a schematic view of the load lock chamber 140 illustrated in FIG. 2, the load lock chamber 140 may be a dual single cavity load lock. The load lock chamber 140 includes a first load lock cavity 201 (e.g., a lower load lock substrate receiving cavity) and a second load lock cavity 202 (e.g., an upper load lock substrate receiving cavity) disposed over the first load lock cavity 201. The first load lock cavity 201 has a first interior volume 221. The second load lock cavity 202 has a second interior volume 222. Each interior volume 221, 222 is sized accommodate a substrate therein.

Each of the first load lock cavity 201 and the second load lock cavity 202 include a respective door 206a, 206b which may be opened to allow access to the load lock cavities 201, 202 for ingress and egress of a substrate. For example, the doors 206a, 206b may be opened to facilitate transfer of a substrate to/from parts of a fabrication facility through a factory interface (FI, not shown), or other areas that are generally maintained at atmospheric pressure, to the vacuum environment maintained in the transfer chamber 110. Slit valves 207a, 207b are provided to facilitate transfer of the substrate 102 between the respective first and second load lock cavities 201, 202, and the transfer chamber 110 in the processing system 100.

In another example, the load lock chamber 140 may include a single load lock cavity, such as the first load lock cavity 201 such that the load lock chamber 140 may handle only a single substrate at a time. In a single substrate cavity configuration, the load lock chamber 140 may function as a pass through for coupling the processing system 100 to an adjoining processing system such that substrates may be transferred between the processing systems without breaking vacuum (i.e., without exposing the substrates to atmospheric pressures).

In yet another example as shown in FIG. 1, the load lock chamber 140A may only have the first load lock cavity 201 such that the load lock chamber 140A may handle only a single substrate at a time, while the load lock chamber 140B may include both the first load lock cavity 201 and the second load lock cavity 202, such that the load lock chamber 140B may handle two substrates simultaneously. Thus, processing system 100 can be configured to transfer substrates between adjacent processing systems through the load lock chamber 140A, while transferring substrates with an atmospheric factory interface through the load lock chamber 140B.

Figure 3:
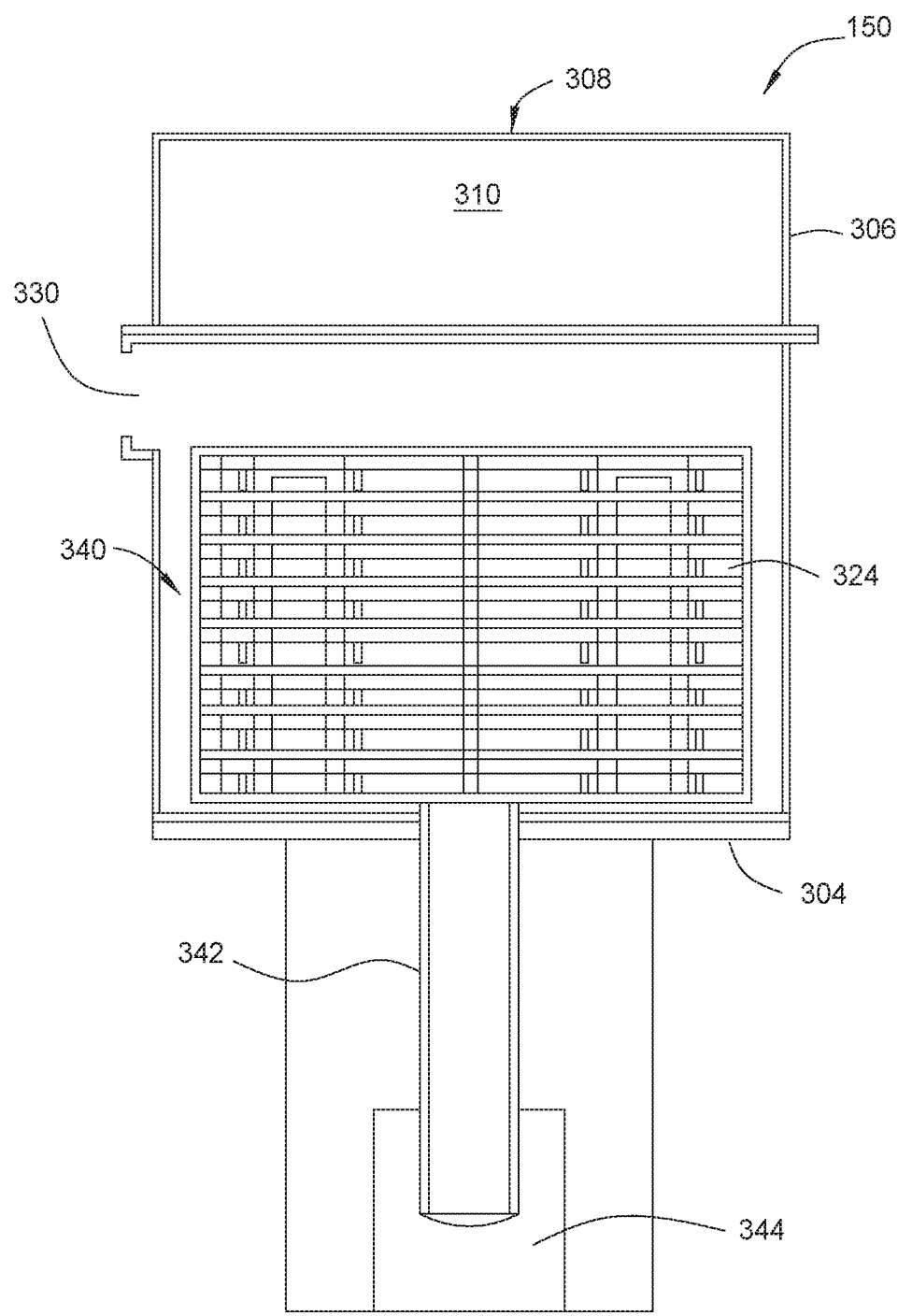
FIG. 3 is a side cross-sectional view of a buffer chamber of FIG. 1, according to one embodiment.

Substrates 102 are moved to and from the processing chamber 120 to and from the load lock chamber 140 by a transfer robot 112, shown in FIG. 1. However, during times where occurrences downstream in the process cause substrates 102 leaving the processing chamber 120 to have nowhere available to go, the substrate 102 may be transferred to the buffer chamber 150. FIG. 3 is a side cross-sectional view of the buffer chamber 150 shown in FIG. 1, according to one embodiment. The buffer chamber 150 is configured to hold substrates 102 while the substrates 102 are waiting to be transferred to another chamber in the processing system 100, or to be transferred from the processing system 100. For example, a first substrate may be scheduled for processing in a first chamber currently occupied by a second substrate undergoing processing therein. The first substrate may be transferred by the transfer robot 112 to the buffer chamber 150 to free up the transfer robot 112 to move other substrates in and from other chambers while the first substrate waits for the availability of one of the processing chambers 120.

The buffer chamber 150 may have a lid 308, walls 306 and a floor 304 which define and enclose an interior volume 310. An opening 330 may be formed in the wall 306. The opening 330 is configured for a substrate 102 to pass therethrough. The buffer chamber 150 may optionally have a slit valve or other closing mechanism for the opening 330. The opening 330 is additionally configured to align with an opening in the transfer chamber 110. A seal, gasket or other suitable technique may utilized to form a seal around the opening 330, such that the buffer chamber 150 may form an air seal with the transfer chamber 110 to maintain pressure within the processing system 100.

The buffer chamber may have a support rack 340. The support rack 340 is supported by a shaft 342. The shaft 342 may be attached to a drive unit 344. The drive unit 344, may be a linear motor, mechanical device, hydraulic unit or other suitable movement mechanism capable of moving the shaft 342 vertically between an extended and retracted position for raising and lowering the support rack 340. The support rack 340 may have slots 324. Each slot 324 may be configured to accept the substrate 102 thereon. The support rack 340 may be configured to hold multiple substrates 102 in respective slots 324. For example, the support rack 340 may have six slots 324 for holding six substrates therein within the interior volume 310 of the buffer chamber 150. The support rack 340 may be raised or lowered by the drive unit 344 to align the slots 324 with the opening 330 for access by the transfer robot 112. The transfer robot 112 may move a substrate from the slot 324 to the load lock chamber 140 or in some instances the processing chamber 120.

Figure 4:
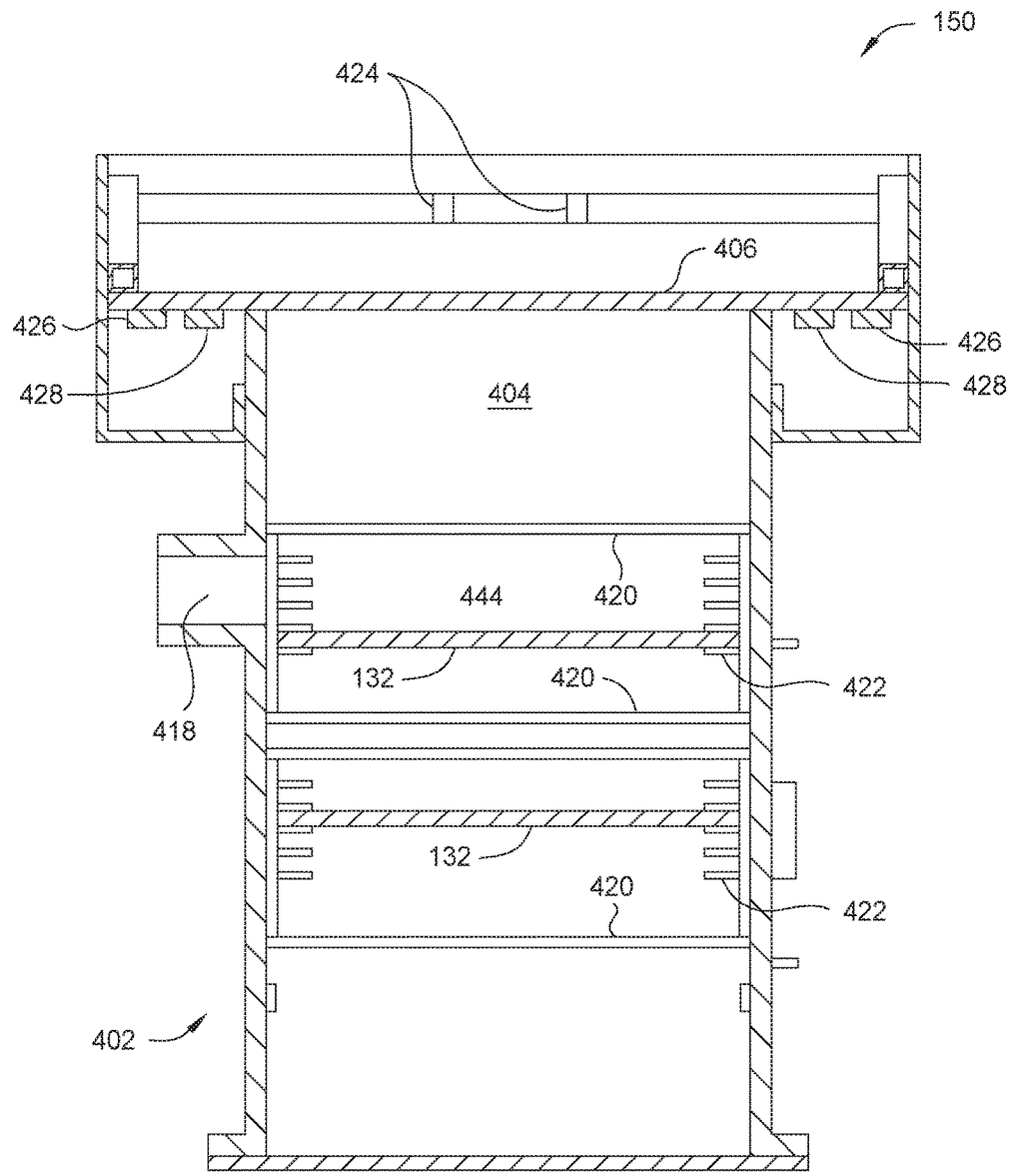
FIG. 4 is a side cross-sectional view of a mask chamber of FIG. 1, according to one embodiment.

The transfer robot 112 may additionally move a mask 132 from the mask chamber 130 to the processing chamber 120 for processing the substrate 102 therein. FIG. 4 is a side cross-sectional view of the mask chamber 130 of FIG. 1, according to one embodiment. A plurality of masks 132 may be utilized during the processes performed in the processing system 100 as further described below. The mask chamber 130 can be used to store the masks 132 to be used in the processes, such as deposition processes, performed in the different processing chambers 120. For example, the mask chamber 130 may store from about 4 to about 30 masks 132 in one or more cassettes 420.

The mask chamber 130 includes a chamber body 402 which defines an inside volume 404. A slit valve 418 may be coupled to the chamber body 402. The slit valve 418 is coupled to the transfer chamber 110 of the processing system 100 and the slit valve 418 is configured to allow for passage of the masks 132 to and from the inside volume 404. The transfer robot 112 is capable of moving the masks 132 through the slit valve 418 in a fashion similar to moving the substrates 102.

A lid member 406 may be coupled to the chamber body 402. The lid member 406 may be configured to open and close, by operation of a lid actuator 428 and track member 426, to enclose the inside volume 404 when the lid member 406 is located in a closed position (as shown).

The inside volume 404 may be sized to receive the cassettes 420 having racks 422 configured to removeably hold the masks 132 therein. The cassettes 420 may be delivered to the mask chamber 130 by a crane or other similar apparatus and positioned within the inside volume 404. Used masks 132 that need to be cleaned or conditioned may be removed from the mask chamber 130 by opening the lid member 406 and removing the cassette 420 containing the used masks. New masks 132 may be provided to the mask chamber 130 by a new cassette 420 and the lid member 406 may then be closed.

Returning back to FIG. 1, the controller 170 contains a central processing unit 172, such as a microprocessor, a memory 174 for storing control routines, and support circuits 176 such as power supplies, clock circuits, cache and the like. The controller 170 also contains I/O peripherals 180 such as a keyboard, mouse, and display. The controller 170 is a general purpose computer that is programmed to perform operations of the processing system 100, including the scheduling operations that facilitate the transport of substrates from source chambers to destination chambers. The software routines that control the processing system 100 are stored in memory 174 and executed by the central processing unit 172 to facilitate control of the processing system 100.

It is contemplated that some of the processes discussed herein as software processes may be implemented within hardware, e.g., as circuitry that cooperates with the central processing unit 172 to perform various processes. Although the controller 170 is depicted as a general purpose computer that is programmed to perform various routines, the processes that are implemented by the software can be implemented as hardware as an application specific integrated circuit (ASIC) or discrete circuit components. As such, the processes described herein are intended to be broadly interpreted as being equivalently performed by software, hardware, or any combination thereof.

Figure 5:
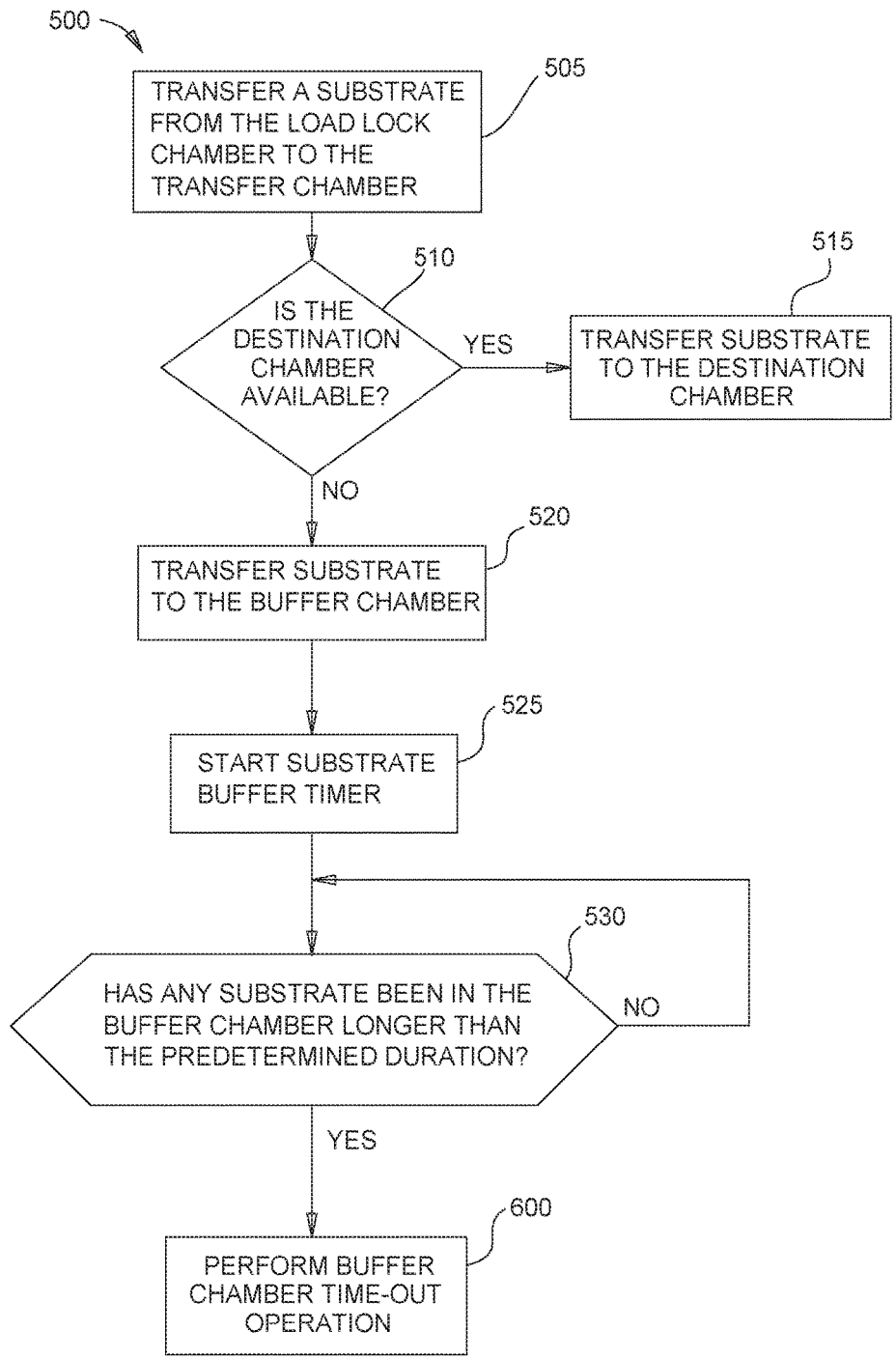
FIG. 5 is a flow diagram of a substrate transfer operation for a substrate transfer operation according to one embodiment.
Figure 6:
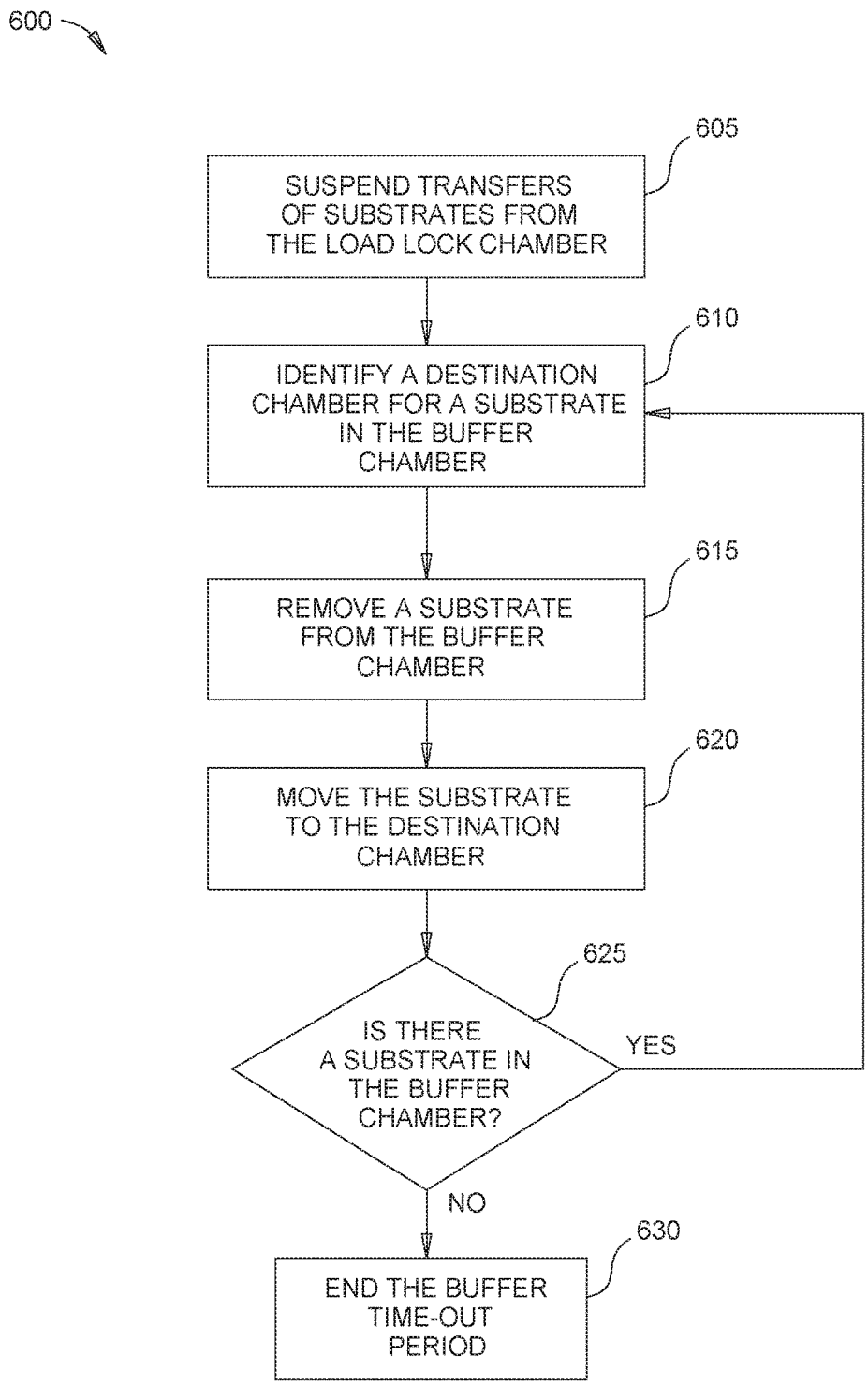
FIG. 6 is a flow diagram of a buffer chamber time-out operation for a buffer chamber time-out operation according to one embodiment.

A first sample operation of the processing system 100 for a method for processing substrates will now be discussed with regard to FIG. 5 and FIG. 6. FIG. 5 is a flow diagram of a substrate transfer operation, and FIG. 6 is a flow diagram of a buffer chamber time-out operation according to one embodiment. The controller 170 executes the operational program to perform the substrate transfer operation and buffer chamber time-out operation, as summarized by FIG. 5. The controller 170 includes an operational program that the controller 170 executes to perform the first sample operation summarized by FIG. 5 and FIG. 6. The process summarized by the flow diagrams of FIG. 5 and FIG. 6 can be performed using the processing system 100.

The substrate transfer operation controls the movement of the substrates between the load lock chambers 140, the processing chambers 120, the buffer chamber 150, and any other chambers in the processing system 100. In one embodiment, the substrate transfer operation includes determining whether a processing chamber 120 is available for receiving a substrate from the load lock chamber 140A. The processing chamber 120 that is selected for the substrate to be transferred may be referred to as the destination chamber. A substrate that is loaded in the load lock chamber 140A and that has not been processed in one or more of the processing chambers 120 of the transfer chamber 110 may be referred to as a new substrate.

Referring to FIG. 5, at block 505 a first substrate $S_n$ is transferred from the load lock chamber 140A to the transfer chamber 110 by the transfer robot 112. At block 510 the controller 170 determines whether a destination chamber is available for the first substrate $S_n$. The destination chamber for the first substrate $S_n$ may be one of the processing chambers 120. In some embodiments, the controller 170 may execute a scheduling algorithm to determine whether a destination chamber is available for the first substrate $S_n$. If a destination chamber is available, at block 515 the first substrate $S_n$ is transferred to the destination chamber that is available so that processing may be performed on the first substrate $S_n$. As substrates are moved to the transfer chamber 110 by the transfer robot 112, additional substrates are placed into queue by being moved to the load lock chamber 140A.

If a destination chamber is not available, then at block 520 the first substrate $S_n$ is transferred to the buffer chamber 150 by the transfer robot 112. When the first substrate $S_n$ is transferred to the buffer chamber 150, at block 525 a substrate buffer timer is started to measure a substrate buffer time that corresponds to the amount of time that the first substrate $S_n$ is held in the buffer chamber. For example, when the first substrate $S_n$ is moved to the buffer chamber a substrate buffer time $T_n$ is measured for the first substrate $S_n$ while the substrate $S_n$ remains in the buffer chamber 150. In an embodiment, a substrate detector, such as a camera or photoelectric device, may be used in determining when the substrate $S_n$ is moved to the buffer chamber 150 and to trigger the start of the substrate timer for the substrate $S_n$. The substrate detector may be located on the buffer chamber 150.

The process described above for the first substrate $S_n$ is repeated for additional substrates that are transferred to the load lock chamber 140A. For example, the controller 170 at block 505 directs the first transfer robot 112 to transfer a second substrate $S_{n+1}$ from the load lock chamber 140A to the transfer chamber 110. The controller 170 at block 510 determines whether a destination chamber is available for the second substrate $S_{n+1}$ that is located in the load lock chamber 140A in a manner similar to that described for the first substrate $S_n$. If a destination chamber is not available for the second substrate $S_{n+1}$, the second substrate $S_{n+1}$ is moved to the buffer chamber 150. The buffer chamber 150 may contain a plurality of substrates, including the first substrate $S_n$ and the second substrate $S_{n+1}$, at a given time. When the second substrate $S_{n+1}$ is moved to the buffer chamber 150, at block 525 a substrate timer is started to measure a substrate buffer time $T_{n+1}$ for the second substrate $S_{n+1}$ while the second substrate $S_{n+1}$ remains in the buffer chamber 150. The controller 170 continues the transfer of substrates from the load lock chamber 140A to the transfer chamber 110 for a plurality of substrates $S_n, S_{n+1}, S_{n+2}, \ldots$ At block 530 the controller 170 determines whether any substrate buffer time ($T_n, T_{n+1}, \ldots$) for any substrate located in the buffer chamber 150 meets the buffer time-out condition, for example by having been in the buffer chamber 150 for longer than a predetermined duration, which may be a buffer time-out duration. The buffer time-out duration may be stored in the memory of the controller 170. In some embodiments, the buffer time-out duration may be selected in the time range from zero to fifty days. In some embodiments, a buffer time-out signal is generated when any one of the substrates in the buffer chamber 150 has been in the buffer chamber 150 for longer than a predetermined duration. At block 600 the controller 170 is triggered to perform a buffer chamber time-out operation in response to any of the substrates remaining in the buffer chamber 150 longer than the predetermined duration.

FIG. 6 is a flow diagram summarizing a buffer chamber time-out operation 600 according to one embodiment. Referring to FIG. 6, the buffer chamber time-out operation 600 is triggered when a substrate is identified as satisfying a buffer time-out condition. After identifying that a substrate in the buffer chamber 150 of the processing system 100 meets a buffer time-out condition, the controller 170 generates a buffer time-out signal. For example, the buffer time-out signal may be any signal that triggers the buffer chamber time-out operation.

At block 605 the controller suspends transfer of substrates from the load lock chamber 140A to the transfer chamber 110 by directing the transfer robot 112 to not transfer substrates from the load lock chamber 140A to the transfer chamber 110 during a buffer time-out period. Suspending movement of substrates from the load lock chamber 140A to the transfer chamber 110 of the processing system 100 during a buffer time-out period triggered in response to the buffer time-out signal allows for efficient transfer of substrates from the buffer chamber 150 during the buffer time-out period. Without the buffer time-out period, substrates may otherwise become stranded in the buffer chamber 150 for an undesirable period of time that may reduce substrate throughput or quality.

The controller 170 may continue controlling the processing of substrates disposed in the processing chambers 120 at the start of the buffer time-out period. For example, the controller 170 may direct the transfer robot 112 to transfer substrates in the processing chambers 120 to the load lock chamber 140A or the load lock chamber 140B or other processing chambers 120 during the buffer time-out period. A vacuum is maintained for the transfer chamber 110 during the buffer time-out period.

During the buffer time-out period, at block 610 the controller 170 identifies a destination chamber for the substrates located in the buffer chamber 150. At block 615 the controller 170 directs the transfer robot 112 to extract one of the substrates from the buffer chamber 150. At block 620 the controller 170 directs the transfer robot 112 to move the extracted substrate from the buffer chamber 150 to the destination chamber. The destination chamber may be a processing chamber 120.

At block 625 the controller 170 determines whether there is a substrate remaining in the buffer chamber 150. If a substrate remains in the buffer chamber 150, the buffer chamber time-out operation continues at block 610, as described above. The process of transferring the substrates in the buffer chamber 150 to destination chambers continues during the buffer time-out period until all of the substrates have been removed from the buffer chamber 150. When there are no substrates remaining in the buffer chamber 150, the buffer time-out period ends. The controller 170 re-starts the movement of substrates from the load lock chamber 140A when the buffer time-out period ends. The substrate transfer operation for transferring substrates from the load lock chamber 140A to the transfer chamber 110 may start again when the controller 170 unsuspends the movement of substrates from the load lock chamber 140A.

The buffer chamber time-out operation 600 may operate as follows where the substrate transfer operation 500 has resulted in a first substrate $S_n$ and a second substrate $S_{n+1}$ being transferred to and stored in the buffer chamber 150. The controller 170 identifies that the first substrate $S_n$ has been in the buffer chamber 150 longer than the predetermined duration. At block 605, the controller 170 suspends movement of substrates to the transfer chamber 110 from the load lock chamber 140A. The controller 170 directs the transfer robot 112 to not extract substrates from the load lock chamber 140A. At block 610 the controller 170 identifies a first destination chamber for first substrate $S_n$. At block 615 and block 620 the controller 170 directs the transfer robot 112 to transfer the first substrate $S_n$ to the first destination chamber. The transfer of the first substrate $S_n$ includes removing the first substrate Sn from the buffer chamber 150 during the buffer time-out period, and moving the first substrate $S_n$ to the first destination chamber after removing the first substrate from the buffer chamber 150.

At block 625 the controller 170 identifies that the second substrate $S_{n+1}$ is in the buffer chamber 150 and at block 610 a second destination chamber is identified for the second substrate $S_{n+1}$. The second destination chamber may be the same chamber as the first destination chamber or a different chamber. At blocks 615 and 620 the second substrate $S_{n+1}$ is transferred to the second destination chamber. At block 625 the controller 170 identifies, for this example, that there are no remaining substrates in the buffer chamber 150.

At block 630 the buffer time-out period ends in response to the identification that there are no remaining substrates in the buffer chamber 150. The buffer time-out period ends after removing the last remaining substrate in the buffer chamber 150 so that the buffer time-out period operation ends after removing every substrate from the buffer chamber. The buffer time-out period ends after the plurality of substrates have been transferred from the buffer chamber 150 so that the buffer chamber 150 is empty when the buffer time-out period ends. Ending the buffer time-out period after the buffer chamber 150 is empty provides the benefit of reducing the number of buffer time-out periods needed during an operation where a large number of substrates are processed. The controller 170 may generate a completed time-out period signal indicating that the buffer time-out period is completed. In the first sample operation, the buffer time-out period ends after removing the first substrate and removing the second substrate from the buffer chamber 150. After the buffer time-out period ends, the movement of substrates from the load lock chamber 140A to the transfer chamber 110 is started in response to the completed time-out period signal. Additional substrates may then be transferred from the load lock chamber 140A to the transfer chamber 110, and to the processing chambers 120. After ending the buffer chamber time-out operation, starting movement of substrates from the load lock chamber 140A allows new substrates from the load lock chamber 140A to be processed.

In an alternative embodiment, the removal of substrates from the buffer chamber 150 during the buffer time-out period may be limited to the substrate that exceeded the buffer time-out period and a predetermined number of additional substrates that may be disposed in the buffer chamber 150. For example, the buffer chamber 150 may have five substrates in the buffer chamber 150 at the start of the buffer time-out period. The predetermined number of additional substrates may be selected to be one. In this example of the alternative embodiment, the controller 170 would direct that the transfer robot 112 remove two substrates during the buffer time-out period so that three substrates are left in the buffer chamber 150 at the end of the buffer time-out period. This alternative embodiment, allows a predetermined number of substrates to be removed from the buffer chamber 150 during the buffer time-out period. An algorithm may be used to select the predetermined number of additional substrates to remove from the buffer chamber 150 during the buffer time-out period.

The buffer chamber time-out operation provides for the removal of a plurality of substrates from the buffer chamber 150 when any one of the substrates in the buffer chamber 150 remains in the buffer chamber longer than a predetermined duration. The buffer chamber time-out operation allows for efficient removal of the substrates in the buffer chamber 150 during the buffer time-out period. The removal of a plurality of substrates when any one substrate exceeds the buffer time-out period helps make the removal of substrates from the buffer chamber 150 more efficient when processing substrates in the processing system 100.

Figure 7:
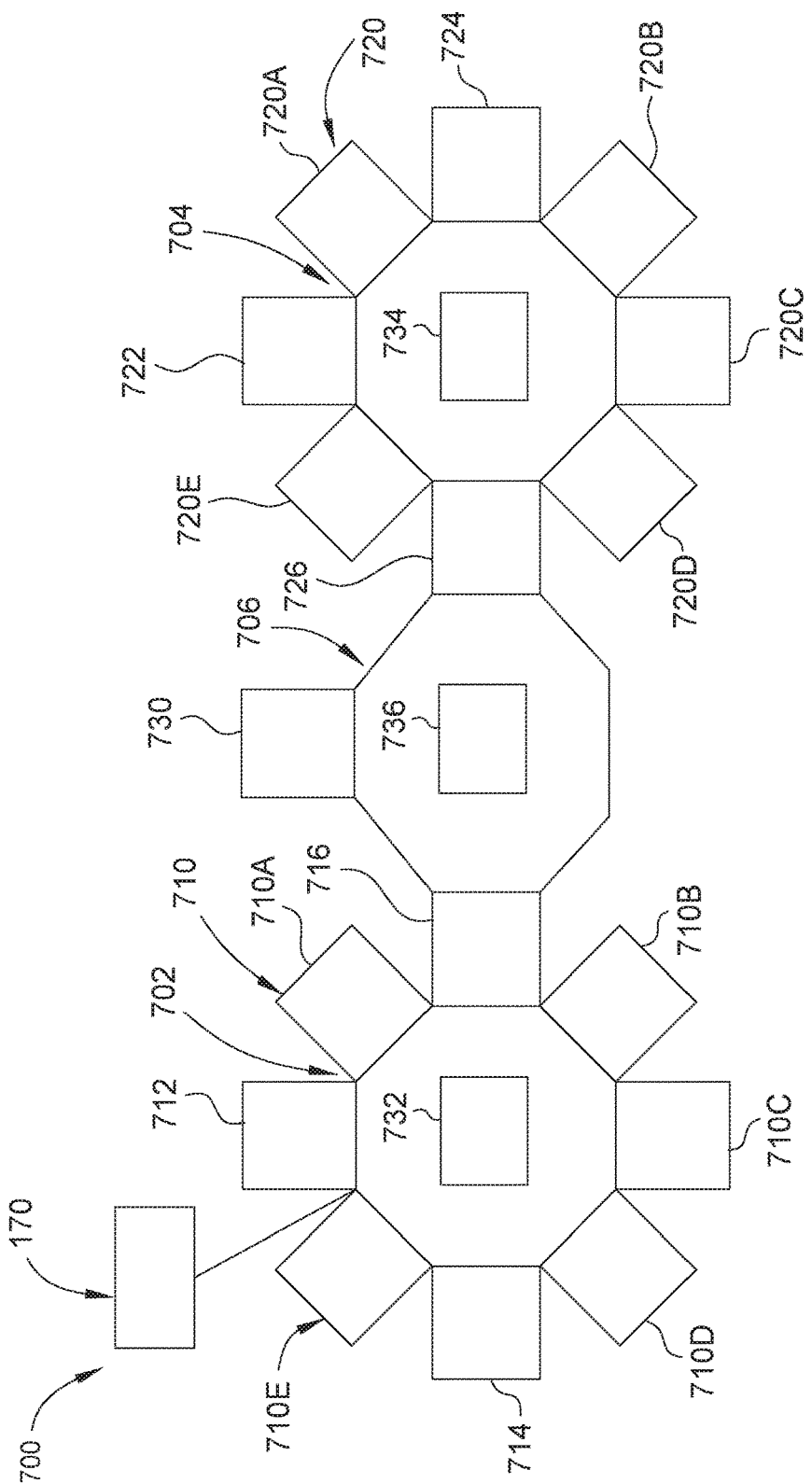
FIG. 7 is a top schematic view of a tandem processing system for vacuum processing a plurality of substrates, according to one embodiment.

FIG. 7 is a top schematic view of a tandem processing system 700 for performing vacuum processing on a plurality of substrates, according to one embodiment of the disclosure. The tandem processing system 700 has a first transfer chamber 702, a second transfer chamber 704, and an intermediate transfer chamber 706. A plurality of first processing chambers 710, a first mask chamber 712, an in load lock chamber 714 and a first passthrough load lock chamber 716 are coupled to the first transfer chamber 702. The first processing chambers 710 include first processing chamber 710A through 710E. A plurality of second processing chambers 720, a second mask chamber 722, and an out load lock chamber 724 are coupled to the second transfer chamber 704. The second processing chambers 720 include second processing chamber 720A through 720E. An intermediate buffer chamber 730 is coupled to the intermediate transfer chamber 706. The intermediate buffer chamber 730 operates similar to the buffer chamber 150 of the processing system 100 except that the intermediate buffer chamber 730 is coupled to the intermediate transfer chamber 706. The first processing chambers 710, in load lock chamber 714, first passthrough load lock chamber 716, second processing chambers 720, and out load lock chamber 724, as well as any additionally attached chambers forming the tandem processing system 700, are sealing coupled to maintain a vacuum environment within the first transfer chamber 702, the second transfer chamber 704, and the intermediate transfer chamber 706. A controller 170 controls the operations of the tandem processing system 700. The operational program may be stored in the memory 174 of the controller 170.

A first transfer robot 732 is disposed in the first transfer chamber 702 and can be used to move the substrates to and from the chambers that surround the first transfer chamber 702, such as the first processing chambers 710, in load lock chamber 714, and first passthrough load lock chamber 716. A second transfer robot 734 is disposed in the second transfer chamber 704 and can be used to move the substrates to and from the chambers that surround the second transfer chamber 704, such as the second processing chambers 720, out load lock chamber 724, and second passthrough load lock chamber 726.

A first tandem sample operation and a second tandem sample operation for the tandem processing system 700 are described below. The process flow for a substrate in the sample operations is from the first transfer chamber 702, to the intermediate transfer chamber 706, and then to the second transfer chamber 704 where processed substrates may be removed from the tandem processing system 700 via the out load lock chamber 724.

The first tandem sample operation for the tandem processing system 700 is for a substrate that is loaded to the in load lock chamber 714 and that has a destination chamber coupled to the first transfer chamber 702. The controller 170 directs the first transfer robot 732 to transfer the substrate from the in load lock chamber 714 to the destination chamber that is designated as the first processing chamber 710A. After processing of the substrate in the first processing chamber 710A, the controller 170 directs the first transfer robot 732 to transfer the processed substrate to the first passthrough load lock chamber 716. The first passthrough load lock chamber 716 couples the first transfer chamber 702 to the intermediate transfer chamber 706.

In the first tandem sample operation, the destination chamber for the processed substrate in the first passthrough load lock chamber 716 is the out load lock chamber 724 coupled to the second transfer chamber 704. In this example, the out load lock chamber 724 is not available, and the controller 170 directs the intermediate transfer robot 736 to transfer the processed substrate from the first passthrough load lock chamber 716 to the intermediate buffer chamber 730. By placing the processed substrate in the intermediate buffer chamber 730, the first passthrough load lock chamber 716 is made available for other substrates that may need to use the first passthrough load lock chamber 716 as a destination chamber.

In the first tandem sample operation, a plurality of processed substrates may be transferred to the intermediate buffer chamber 730. At a given time during the operations of the tandem processing system 700, the intermediate buffer chamber 730 may store a plurality of processed substrates. The controller 170 directs the substrate transfer operation in a similar manner for both the tandem processing system 700 and the processing system 100 with respect to what triggers the transfer of substrates from the intermediate buffer chamber 730 and buffer chamber 150, respectively.

Referring to FIG. 5, in the first tandem sampling operation at block 525 a substrate buffer timer is started for the processed substrate when the processed substrate is transferred to the intermediate buffer chamber 730. At block 600 a buffer chamber time-out operation is triggered when any one of the substrates stored in the intermediate buffer chamber 730 remains in the intermediate buffer chamber 730 longer than the predetermined duration. For example, the buffer chamber time-out operation is triggered when a processed substrate remains in the intermediate buffer chamber 730 longer than the predetermined duration. From a start of the buffer chamber time-out operation to an end of the buffer chamber time-out operation. The controller 170 suspends the movement of substrates from the load lock chamber 140A during a buffer time-out period triggered in response to the buffer time-out signal.

Referring to FIG. 6, in the first tandem sampling operation at block 605 the controller 170 starts a buffer time-out period where movement of substrates from the in load lock chamber 714 to the first transfer chamber 702 is suspended during the buffer time-out period. The controller 170 continues to direct the movement of substrates in the tandem processing system 700 with the exception that transfer of new substrates to the first transfer chamber 702 is suspended. In the first tandem sampling operation, the controller 170 directs the intermediate transfer robot 736 to transfer the processed substrate from the intermediate buffer chamber 730 to the second passthrough load lock chamber 726. The controller 170 then directs the second transfer robot 736 to transfer the processed substrate from the second passthrough load lock chamber 726 to the out load lock chamber 724 where the processed substrate may be removed from the tandem processing system 700. In the first tandem sample operation, at block 610, block 615, and 620 the controller 170 continues the operation of transferring substrates from the intermediate buffer chamber 730 during the buffer time-out period in a manner as described in the discussions for processing system 100.

The second tandem sample operation for the tandem processing system 700 is for a substrate that is loaded to the in load lock chamber 714 and that has a destination chamber coupled to the second transfer chamber 704. In the second tandem sample operation, the destination chamber for the new substrate for the in load lock chamber 714 is the second processing chamber 720A coupled to the second transfer chamber 704. When the second processing chamber 720A is not available, the controller 170 directs the first transfer robot 732 to transfer the new substrate from the in load lock chamber 714 to the first passthrough load lock chamber 716, and then from the first passthrough load lock chamber 716 to the intermediate buffer chamber 730.

By placing the new substrate in the intermediate buffer chamber 730, the first passthrough load lock chamber 716 is made available for other substrates, including new substrates and processed substrates, that may need to use the first passthrough load lock chamber 716.

The second tandem sample operation operates as discussed for the first tandem sample operation with respect to what triggers the transfer of substrates from the intermediate buffer chamber 730. For example, the buffer chamber time-out operation 600 is triggered when the new substrate remains in the intermediate buffer chamber 730 longer than the predetermined duration. During the buffer time-out period, the controller 170 directs the intermediate transfer robot 736 to transfer the new substrate from the intermediate buffer chamber 730 to the second passthrough load lock chamber 726, and the controller 170 then directs the second transfer robot 734 to transfer the new substrate from the second passthrough load lock chamber 726 to the second processing chamber 720A for processing. As discussed with respect to the first tandem sampling operation, a plurality of substrates may be stored in the intermediate buffer chamber 730 at a particular time during the operation of the tandem processing system 700. In some embodiments, a plurality of new substrates may be stored in the intermediate buffer chamber 730.

In other embodiments, a plurality of processed substrates may be stored in the intermediate buffer chamber 730. In other embodiments, both new substrates and processed substrates may be stored in the intermediate buffer chamber 730. During the buffer time-out period of the second tandem sample operation, substrates may be removed from the intermediate buffer chamber 730 in the same manner as discussed with respect to the first tandem sample operation.

The processing system 100 and the tandem processing system 700 described above allows for processes to be performed on a large number of substrates at a high throughput. Triggering a buffer time-out period to remove a plurality of substrates from the buffer chamber 150 of the processing system 100 and the intermediate buffer chamber 730 of the tandem processing system 700 provides for a more efficient method to remove substrates that may be stranded in storage. Efficiently handling substrates in storage improves the movement of the substrates between chambers and helps improve the throughput of substrates. Improved throughput of substrates reduces operational costs for the system and the overall cost of fabrication.

While the foregoing is directed to embodiments of the present disclosure, other and further embodiments of the disclosure may be devised without departing from the basic scope thereof, and the scope thereof is determined by the claims that follow.

The invention claimed is:

1. A method for processing substrates in a processing system comprising:
   identifying, in a buffer chamber coupled to a transfer chamber of a processing system, a first substrate that has been in the buffer chamber longer than a predetermined duration;
   identifying a first destination chamber of the processing system for the first substrate;
   after identifying the first substrate, performing a buffer chamber time-out operation, wherein the buffer time out operation comprises suspending movement of substrates from a load lock chamber to the transfer chamber and removing the first substrate from the buffer chamber.

2. The method of claim 1, further comprising:
storing a plurality of substrates in the buffer chamber; and
ending the buffer chamber time-out operation after the plurality of substrates have been removed from the buffer chamber.

3. The method of claim 1, wherein the first substrate is a substrate that has been processed in a processing chamber of the processing system.

4. The method of claim 1, wherein a predetermined number of substrates are removed from the buffer chamber during the buffer chamber time-out operation.

5. The method of claim 1, further comprising:
identifying a second destination chamber of the processing system for a second substrate in the buffer chamber,
wherein the buffer chamber time-out operation further comprises removing the second substrate from the buffer chamber.

6. The method of claim 5, further comprising:
ending the buffer chamber time-out operation after removing every substrate from the buffer chamber; and
after ending the buffer chamber time-out operation, starting movement of substrates from the load lock chamber to the transfer chamber.

7. The method of claim 1, wherein the first substrate is a substrate that has not been processed in a processing chamber of the processing system.

8. The method of claim 7, further comprising:
moving the first substrate, using a transfer robot, from the load lock chamber to the buffer chamber; and
moving the first substrate to the first destination chamber after removing the first substrate from the buffer chamber.

9. The method of claim 8, wherein the transfer robot is in a first transfer chamber, and wherein the buffer chamber is coupled to the first transfer chamber.

10. The method of claim 7, further comprising:
moving the first substrate, using a transfer robot, from the load lock chamber to the buffer chamber.

11. The method of claim 10, wherein the first destination chamber is a processing chamber.

12. The method of claim 10, wherein the transfer robot is in a first transfer chamber, and wherein the buffer chamber is coupled to the first transfer chamber.

13. A method for processing substrates comprising:
identifying, in a buffer chamber of a processing system, a first substrate that has been in the buffer chamber longer than a predetermined duration, wherein the processing system further includes:
a first transfer chamber,
a load lock chamber coupled to the first transfer chamber,
a second transfer chamber,
an intermediate transfer chamber coupled to the buffer chamber,
a first passthrough load lock chamber that couples the first transfer chamber with the intermediate transfer chamber, and
a second passthrough load lock chamber that couples the second transfer chamber with the intermediate transfer chamber;
identifying a first destination chamber for the first substrate, wherein the first destination chamber is coupled to the second transfer chamber;
after identifying the first substrate, performing a buffer chamber time-out operation, wherein the buffer chamber time-out operation comprises suspending movement of substrates from the load lock chamber to the first transfer chamber and removing the first substrate from the buffer chamber.

14. The method of claim 13, further comprising:
storing a plurality of substrates in the buffer chamber; and
ending the buffer chamber time-out operation after the plurality of substrates have been removed from the buffer chamber.

15. The method of claim 13, further comprising:
identifying a second substrate in the buffer chamber;
identifying a second destination chamber for the second substrate in the buffer chamber, wherein the second destination chamber is coupled to the second transfer chamber; and
wherein the buffer chamber time-out operation further comprises removing the second substrate from the buffer chamber.

16. The method of claim 15, further comprising:
ending the buffer chamber time-out operation after removing every substrate from the buffer chamber; and
after ending the buffer chamber time-out operation, starting movement of substrates from the load lock chamber to the first transfer chamber.

17. The method of claim 15, wherein first transfer chamber has a first transfer robot, the second transfer chamber has a second transfer robot, and the intermediate transfer chamber has an intermediate transfer robot.

18. A non-transitory machine readable storage medium having stored thereon a computer program for processing substrates in a processing system, the computer program comprising a routine of set instructions for causing the processing system to perform a process comprising:
identifying, in a buffer chamber coupled to a transfer chamber of a processing system, a first substrate that has been in the buffer chamber longer than a predetermined duration;
identifying a first destination chamber of the processing system for the first substrate;
after identifying the first substrate, performing a buffer chamber time-out operation, wherein the buffer time out operation comprises suspending movement of substrates from a load lock chamber to the transfer chamber and removing the first substrate from the buffer chamber.

19. The non-transitory machine readable storage medium of claim 18, wherein the process further comprises:
identifying a second destination chamber of the processing system for a second substrate in the buffer chamber; and
wherein the buffer chamber time-out operation further comprises removing the second substrate from the buffer chamber.

20. The non-transitory machine readable storage medium of claim 18, wherein the process further comprises:
ending the buffer chamber time-out operation after removing every substrate from the buffer chamber; and
after ending the buffer chamber time-out operation, starting movement of substrates from the load lock chamber to the transfer chamber.

* * * * *